United States Patent
Takehiro

(12) 
(10) Patent No.: US 6,284,580 B1
(45) Date of Patent: Sep. 4, 2001

(54) METHOD FOR MANUFACTURING A MOS TRANSISTOR HAVING MULTI-LAYERED GATE OXIDE

(75) Inventor: Shinobu Takehiro, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/590,013

(22) Filed: Jun. 9, 2000

(30) Foreign Application Priority Data

Feb. 23, 2000 (JP) .................................... 12-045278

(51) Int. Cl.⁷ .................................... H01L 21/336
(52) U.S. Cl. .................... 438/197; 438/264; 438/516; 438/530; 438/585; 438/769; 438/770; 438/775; 438/787; 438/791
(58) Field of Search ..................... 438/197, 264, 438/585, 765, 766, 769, 770, 775, 787, 791, 516, 530

(56) References Cited

FOREIGN PATENT DOCUMENTS

| | | |
|---|---|---|
| 4-269859 | 9/1992 | (JP) . |
| 5-167008 | 7/1993 | (JP) . |
| 10-135207 | 5/1998 | (JP) . |
| 10-209449 | 8/1998 | (JP) . |
| 11-67760 | 3/1999 | (JP) . |

OTHER PUBLICATIONS

Yider Wu et al., "Ultrathin Nitride/Oxide (N/O) Gate Dielectrics For p⁺–poly Gated PMOSFETs Prepared by a Combined Remote Plasma Enhanced CVD/Thermal Oxidation Process," Extended Abstracts of the 1998 International Conference on Solid State Devices and Materials, Hiroshima, 1998, pp. 106–107.

K. Sekine et al., "High–integrity Ultra–thin Silicon Film Grown at Low Temperature for Extending Scaling Limit of Gate Dielectric," 1999 Symposium on VLSI Technology Digest of Technical Papers, pp. 115–116.

S. Mahapatra et al., "100 nm Channel Length MNSFETs using A Jet Vapor Deposited Ultra–thin Silicon Nitride Gate Dielectric," 1999 Symposium on VLSI Technology Digest of Technical Papers, pp. 79–80.

*Primary Examiner*—Long Pham
(74) *Attorney, Agent, or Firm*—Venable; Robert J. Frank; Allen Wood

(57) ABSTRACT

In a pretreatment process, a silicon oxide film (13) with nitrogen content is formed on a semiconductor substrate (10). In a segregation process executing heat treatment in an inert gas atmosphere, a silicon nitride layer (14) segregates out at the interface of the silicon substrate (10) and the silicon oxide film (13). In a high dielectric film forming process, the unnecessary silicon oxide film (13) on the silicon nitride layer (14) is removed, a high dielectric oxide layer (15) is formed on the exposed silicon nitride layer (14). Whereby, a gate electrode (16) consisting of the silicon nitride layer (14) and the high dielectric oxide layer (15) is formed.

5 Claims, 4 Drawing Sheets

METHOD FOR MANUFACTURING A MOS TRANSISTOR HAVING MULTI-LAYERED GATE OXIDE

BACKGROUND OF THE INVENTION

1. Field of the Invention

The present invention relates to a method for manufacturing a MOS transistor, and more particularly to a method for manufacturing a MOS transistor having excellent electrical characteristics.

2. Description of the Related Art

For a semiconductor substrate for a LSI circuit with high density integration of MOS transistors, a silicon semiconductor substrate is generally used. A possible way to improve the operating speed of this LSI circuit is to increase the electrostatic capacity between a gate formed on a gate oxide film in the active region of the semiconductor substrate for the MOS transistor and the active region below the gate.

This electrostatic capacity is connected with the thickness of the gate oxide film and the dielectric constant of the material of the gate oxide film. To take an example, by using tantalum oxide ($Ta_2O_5$) having a high specific dielectric constant of about 25 to form the gate oxide film, the electrostatic capacity can be increased without making the gate oxide film so thin as to cause a problem of stray current due to the thinning of the gate oxide film.

Meanwhile, the gate oxide film consisting of tantalum oxide is formed in an atmosphere of oxygen gas. For this reason, a silicon oxide film ($SiO_2$) with a low dielectric constant is formed between the tantalum oxide and the silicon semiconductor substrate, and this silicon oxide film impedes the increase of the electrostatic capacity.

Therefore, it has been proposed to adopt a multi-layered gate oxide film consisting of a silicon nitride layer and a tantalum oxide layer, made by first forming on the active region a silicon nitride layer ($Si_3N_4$) that shows a higher dielectric constant than that of the oxide film and inhibits the growth of the silicon oxide and then forming a tantalum oxide layer on the silicon nitride layer (e.g., JP-A-07-167008).

As the active region is covered with the silicon nitride layer before the tantalum oxide layer is formed on the active region of the silicon substrate, the silicon nitride layer prevents oxygen from penetrating into the silicon substrate during the formation of tantalum oxide layer on the silicon nitride layer. Therefore, the growth of a silicon oxide layer is inhibited, making it possible to prevent a decrease in the electrostatic capacity due to the growth of the silicon oxide layer and thus secure a desired electrostatic capacity.

As technique for forming a silicon nitride layer on a silicon semiconductor substrate as mentioned above, there are methods such as RTN (Rapid Thermal Nitrization) for directly nitriding a silicon semiconductor substrate in an ammonia gas atmosphere (JP-A-05-167008), LPCVD (low-pressure CVD, JP-A-04-269859), Jet Vapor Deposition (by S. Mahapatra et al., 1999 VLSI Tech. Dig. P.79) and a nitrizing method using a high density plasma (Katsuyuki Sekine et al. 1999 VLSI Tech. Dig. P.115).

However, any of those methods uses ammonia ($NH_3$) as a nitrizing gas and by heat treatment in an ammonia gas atmosphere, hydroxyl groups (OH) produced by combinations of oxygen atoms from a naturally oxidized film on the semiconductor substrate with hydrogen atoms from the ammonia are introduced into the gate oxide film. The OH groups in the gate oxide film act as a charge trap, resulting in deterioration of the electrical characteristics of the MOS transistor.

Therefore, the object of the present invention is to provide a method for manufacturing a MOS transistor capable of improving its operation speed by increasing the electrostatic capacity without incurring the deterioration of electrical characteristics caused by a charge trap.

SUMMARY OF THE INVENTION

To solve the above problem, the present invention adopts the following configuration.

According to the present invention, there is provided a method for manufacturing a MOS transistor having a gate oxide film formed on an active region of a silicon semiconductor substrate, the gate oxide film consisting of a silicon nitride layer for inhibiting the penetration of oxygen into the silicon substrate and a high dielectric oxide layer with higher dielectric constant than that of the silicon nitride layer, comprising the steps of pretreatment for forming a silicon oxide film with nitrogen atoms on the active region; segregation for causing a silicon nitride layer to segregate out at an interface between the silicon substrate and the silicon oxide film by heat-treating the pretreated silicon substrate in an inert gas atmosphere; forming a high dielectric film by removing the unnecessary silicon oxide film on the silicon nitride layer to expose a segregated silicon nitride layer and depositing a high dielectric oxide layer on the exposed silicon nitride layer; and forming a gate on the gate oxide film consisting of the silicon nitride layer and the high dielectric oxide layer.

In the above-mentioned manufacturing method according to the present invention, by the above-mentioned segregation process, a silicon nitride layer segregates out at the interface between the nitrogen-containing silicon oxide formed on the active region by the pretreatment and the silicon substrate. The unnecessary silicon oxide film on is removed, and a high dielectric oxide layer with a higher dielectric constant than that of the silicon nitride layer is formed on the exposed silicon nitride layer. Thus, a multi-layered gate oxide film consisting of the silicon nitride layer and the high dielectric oxide layer has been formed, and then a gate is formed on top of the gate oxide film.

The silicon nitride layer formed by segregation does not include impurities such as hydroxyl groups and has had the unnecessary silicon oxide film removed. Therefore, even if hydroxyl groups that act as a charge trap were formed in the silicon oxide film, a charge trap, which used to occur heretofore, is not formed in the gate oxide film consisting of the silicon nitride layer and the high dielectric oxide layer on the silicon nitride film.

Therefore, according to the present invention, it is possible to produce a MOS transistor free from deterioration of characteristics caused by charge traps in the gate oxide film.

The high dielectric oxide layer may be formed in an oxygen gas atmosphere.

As the above-mentioned pretreatment, it is possible to adopt an annealing process in a nitrogen oxide gas atmosphere free of ammonia gas. As an alternative to the annealing process, a process may be adopted which comprises a nitrogen ion injection step for introducing nitrogen ions into the active region and a heat-treating step for forming the silicon oxide film. In comparison with the pretreatment using ammonia gas, those kinds of pretreatment are preferred because they do not include ammonia gas and thus securely prevent the generation of hydroxyl groups that act as charge traps.

For the segregation process, an annealing process by rapid thermal annealing (RTA) may be adopted. By adopting this rapid thermal annealing process, the silicon nitride layer can made to segregate out more efficiently at the interface of the silicon oxide film and the silicon substrate.

DESCRIPTION OF PREFERRED EMBODIMENTS

The present invention will be described with reference to the embodiments shown in the accompanying drawings.

<Embodiment 1>

FIGS. 1(a) to 1(g) show the manufacturing steps of a first embodiment of the method for manufacturing steps of a MOS transistor according to the present invention.

In the embodiment shown in FIGS. 1(a) to 1(g), for the semiconductor substrate, a p-type silicon semiconductor substrate for example is used.

Figure 1A:
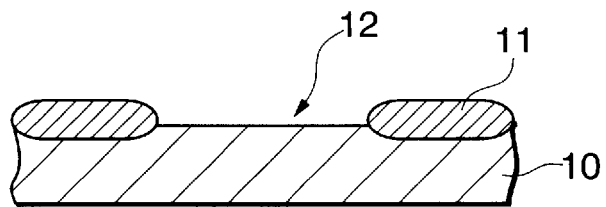
FIGS. 1(a) to 1(g) show the manufacturing steps of a first embodiment of the method for manufacturing a MOS transistor according to the present invention.

As shown in FIG. 1(a), on the surface of a p-type silicon semiconductor substrate, an active region 12 as a device forming region is delimited by isolation regions 11 about 50 nm to 300 nm in thickness made of field oxide film formed, for example, by the well-known LOCOS method.

Figure 1B:
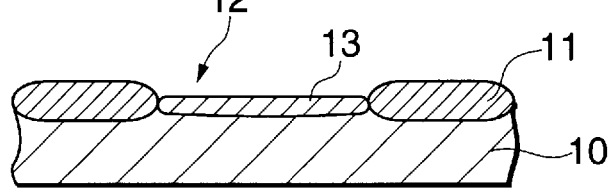

After the active region 12 is formed, the semiconductor substrate 10 is given the first heat treatment, that is, the first annealing in an atmosphere of nitrous oxide gas ($N_2O$), for example. In this heat treatment, RTA (rapid thermal annealing) is preferably used, and by pretreatment by RTA at 700° C. to 1200° C., for example, a nitrogen-containing silicon oxide film 13 with a thickness of 1 nm to 20 nm, for example, is formed on the semiconductor substrate 10 as shown in FIG. 1(b).

Figure 1C:
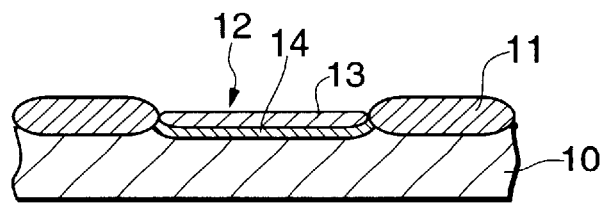

After the silicon oxide film 13 is formed, in an inert gas such as nitrogen gas ($N_2$), the semiconductor substrate 10 undergoes the second heat treatment following the first heat treatment as pretreatment. This second heat treatment, in other words, the second annealing may be performed by RTA at 700° C. to 1200° C., for example, as in the pretreatment. By the second heat treatment, as shown in FIG. 1(c), a silicon nitride layer 14 is formed with a thickness of 0.4 nm to 0.2 nm for example between the semiconductor substrate 10 and the silicon oxide film 13 by segregation, that is, pile-up of nitrogen atoms from the silicon oxide film.

The nitrogen atom segregation phenomenon of the silicon nitride layer is described, for example, on pages 106 and 107 of SSDM (Solid State Devices and Materials, the Society of Applied Physics) 1998.

As the segregation process of the silicon nitride layer 14, a heat treatment other than RTA can be adopted. However, RTA mentioned above should preferably be adopted in terms of efficient formation, in other words, effective segregation of the silicon nitride layer 14.

Figure 1D:
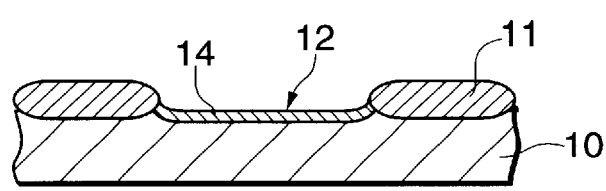

After the silicon nitride layer 14 is formed, the unnecessary silicon oxide film 13 on the silicon nitride layer 14 is removed as shown in FIG. 1(d). For removal of the silicon oxide film 13, etching can be done with a solution of 0.1% to 10% hydrofluoric acid, for example.

Because the silicon oxide film 13 is removed by etching, even if impurities such as hydroxyl groups are contained in the silicon oxide film 13, those impurities are removed when the silicon oxide film 13 is removed.

Figure 1E:
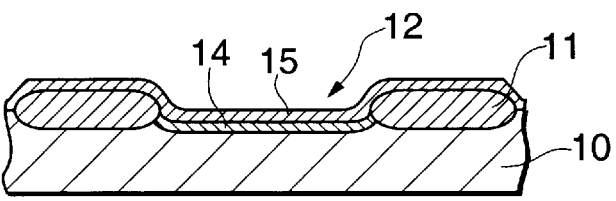

Over the isolation regions 11 and the silicon nitride layer 14 exposed on the active region 12 by removal of the silicon oxide film 13, a tantalum oxide layer ($Ta_2O_5$) for example, which has a higher dielectric constant than the silicon nitride layer 14 is formed as shown in FIG. 1(e).

The tantalum oxide layer 15 is formed with a thickness of 2 nm to 20 nm for example in an oxygen gas atmosphere by MOCVD for example. After the tantalum oxide layer 15 is formed, the tantalum oxide layer 15 receives oxidation annealing by RTA for example in an oxygen gas atmosphere.

The formation and the subsequent annealing of the tantalum oxide layer 15 are carried out in an oxygen gas atmosphere as mentioned above. Prior to the formation of the tantalum oxide layer 15, the active region 12 is covered with the silicon nitride layer 14 that inhibits the penetration of oxygen. For this reason, the growth of the silicon oxide film with a low dielectric constant under the tantalum oxide layer 15 can be inhibited effectively. Therefore, the formation of the silicon oxide film under the tantalum oxide layer 15 is substantially inhibited.

With the addition of the tantalum oxide layer 15, a multi-layered gate oxide film (14 and 15) consisting of the silicon nitride layer 14 and the tantalum oxide film 15 has been formed on the active region 12 of the semiconductor substrate 10.

Figure 1F:
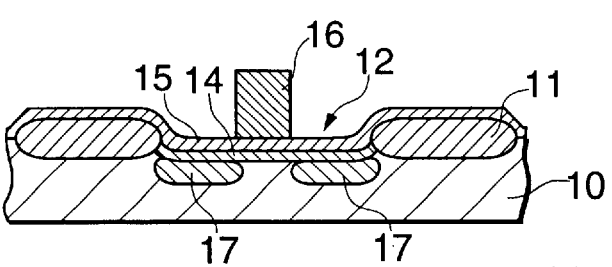

On the gate oxide film (14 and 15), after a titanium nitride (TiN), used as a gate electrode material, is formed by a well-known sputtering method, by photolithographic patterning or etching of the titanium nitride film, a gate electrode 16 is formed as shown in FIG. 1(f).

For example, phosphorus ions are introduced selectively into the active region 12 by ion implantation with the gate electrode 16 as a mask, and as the semiconductor substrate 10 receives heat treatment, a pair of diffused regions, that is, the well-known source and drain regions 17, 17 are formed in the active region.

Figure 1G:
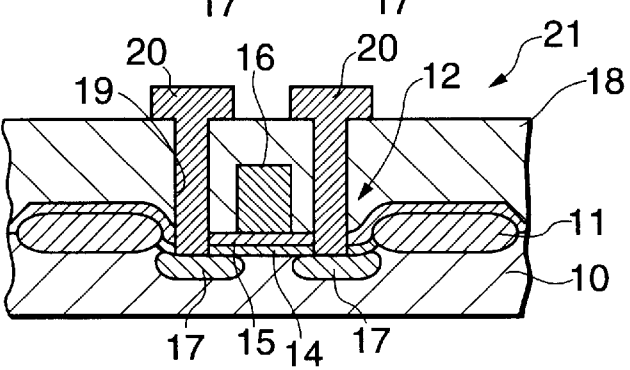

Subsequently, as shown in FIG. 1(g), to bury the gate electrode 16, an inter-layer dielectric 18 consisting of silicon oxide, for example, is formed on the semiconductor substrate 10 by CVD for example. As is well known, in the inter-layer dielectric 18, contact holes 19 open to the drain and source regions 17, 17 are formed by photolithography, for example. On the inter-layer dielectric 18, a metallic material, such as aluminum, is deposited by sputtering, for example, to fill the contact holes 19 with, and the unnecessary portions of the deposited metallic material are removed by a photolithographic technique, leaving wiring patterns 20 leading to the source and drain regions 17, 17. Thus, a MOS transistor 21 is formed.

In the method for manufacturing a MOS transistor 21 according to the present invention, because the formation of the silicon oxide film 13 is done in an atmosphere of a gas not with hydrogen atoms as the source of hydroxyl groups, charge traps by hydroxyl groups, which used to occur before, are not formed in the silicon oxide film 13. Therefore, a MOS transistor's electrical characteristics are not affected by charge traps by hydroxyl groups.

Moreover, because the silicon nitride layer 14 that inhibits the penetration of oxygen is formed by segregation of nitrogen atoms between the silicon oxide film 13 and the semiconductor substrate 10, the thickness of the silicon nitride film 14 can be adequately controlled at such a small value as 0.5 nm or less, for example and therefore a uniform thickness can be achieved relatively easily.

Therefore, a multi-layered gate oxide film (14 and 15), which shows an adequate dielectric constant, can be formed without permitting the growth of silicon oxide under the gate electrode that incurs a decrease in dielectric constant and without permitting unnecessary charge traps to be formed. Thus, it is possible to create a MOS transistor 21 that exhibits better electrical characteristics relatively easily.

In the foregoing, description has been made of an embodiment in which the silicon oxide film 13 with nitrogen content is formed without using an ammonia atmosphere. The silicon oxide film 13, after the silicon nitride layer 14 has segregated out under it, is removed as an unnecessary portion, so that the MOS transistor's electrical characteristics are not greatly affected by impurities in the silicon oxide film 13. Therefore, alternatively, it is also possible to form the silicon oxide film 13 with nitrogen content in an ammonia atmosphere, but to securely prevent the occurrence of charge traps by hydroxyl groups, as described above, it is desirable to form the silicon oxide film 13 with nitrogen content in an atmosphere of a non-ammonia nitrogen oxide gas, such as nitrogen oxide not including ammonia.

<Embodiment 2>

FIGS. 2(a) to 2(d) show an embodiment using ion implantation to form a silicon oxide film 13 with nitrogen content.

Figure 2A:
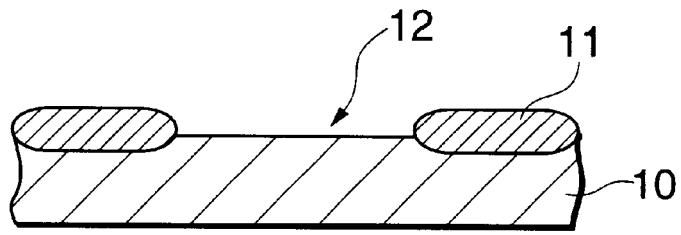
FIGS. 2(a) to 2(d) show the manufacturing steps of a second embodiment of the method for manufacturing a MOS transistor according to the present invention.

As shown in FIG. 2(a), just as described in the first embodiment, isolation regions 11 that delimit the active region 12 is formed on the semiconductor substrate 10, which is the same as the one in the first embodiment.

Figure 2B:
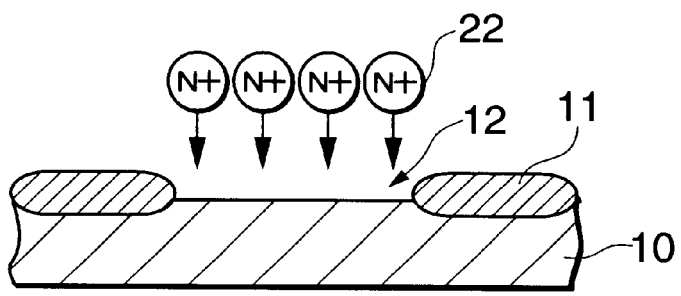

As shown in FIG. 2(b), nitrogen ions 22 are implanted into the active region 12 from its surface at an accelerating voltage of 10 kV to 100 kV, for example.

The semiconductor substrate 10 in which nitrogen atoms have been implanted into substantially the whole surface of the active region 12 by ion implantation is given heat treatment in an atmosphere of nitrous oxide gas. In this heat treatment, RTA is preferably carried out at 700° C. to 1200° C., for example. By pretreatment including this first heat treatment, a silicon oxide film 13 with nitrogen content, which is the same as the silicon oxide film shown in FIG. 1(b), is formed on the active region 12 (Refer to FIG. 2(c)).

Figure 2C:
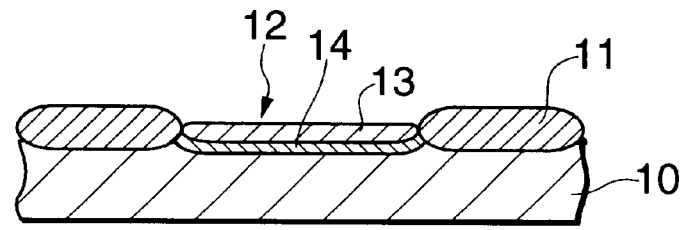

The semiconductor substrate 10 having this silicon oxide film 13 deposited thereon is given the second heat treatment in the same way as in the first embodiment. As shown in FIG. 2(c), by this second heat treatment, a silicon nitride layer 14 same as that in the first embodiment segregates between the silicon oxide film 13 and the semiconductor substrate 10.

Figure 2D:
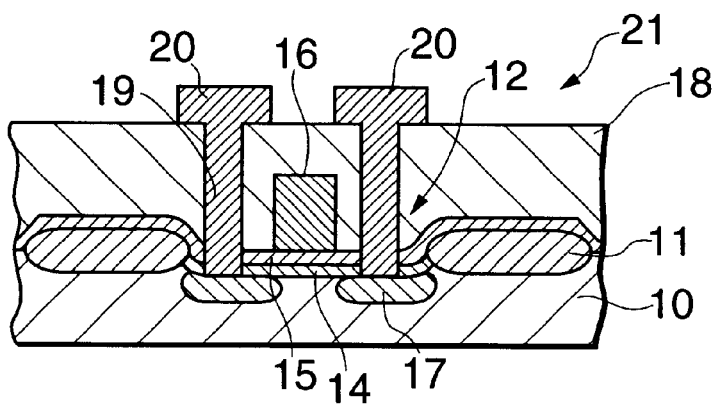

After the silicon oxide film 13 on the silicon nitride layer 14 is removed by the same etching as in the first embodiment, as shown in FIG. 2(d), the same tantalum oxide layer 15 as that in the first embodiment is formed, so that the gate oxide film (14 and 15) of the same multi-layered structure as described above is formed on the active region 12.

By ion implantation through the gate oxide film (14 and 15), the source and drain regions 17, 17 same as those described above are formed as shown in FIG. 2(d). On the gate oxide film (14 and 15), the same layers as those in the first embodiment are formed, that is, the gate electrode 16, the inter-layer dielectric 18, in which the gate electrode is buried, the contact holes 19 that pass through the inter-layer dielectric to the source and drain regions 17, 17 and the wiring material 20 that fills up the contact holes. Thus, a MOS transistor 21 is formed.

According to the second embodiment, because the silicon oxide film 13 with nitrogen content is formed by using ion implantation, nitrogen content can be more efficiently introduced into the silicon oxide film 13 than in the first embodiment. Therefore, after the pretreatment including this ion implantation, in the segregation step as the second heat treatment, the silicon nitride layer 14 can be made to segregate out more effectively.

Consequently, it becomes possible to decrease the heat treatment temperature for segregation and shorten the heat treatment time, with the result that heat treatment damage can be prevented, such as crystal dislocations and their propagation caused by high-heat treatment of the semiconductor substrate 10, and as the deterioration in performance by the heat treatment damage is prevented, the MOS transistor will have improved performance.

<Embodiment 3>

FIGS. 3(a) to 3(f) show an embodiment in which the silicon oxide film 13 with nitrogen content is formed by ion implantation with a mask for partially exposing the central portion of the active region 12.

Figure 3A:
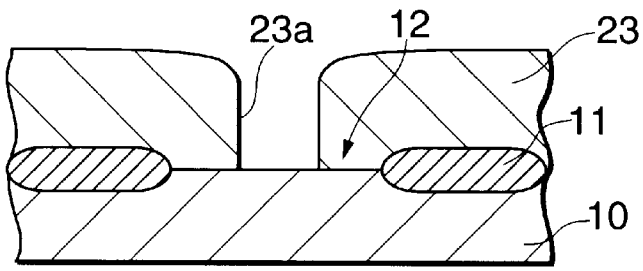
FIGS. 3(a) to 3(f) show the manufacturing steps of a third embodiment of the method for manufacturing a MOS transistor according to the present invention.

As shown in FIG. 3(a), a mask material 23 is deposited by CVD for example, such as silicon oxide, with a thickness of 10 nm to 200 nm, for example, to cover the isolation regions 11, 11 on the semiconductor substrate 10 and the active region 12 delimited by the isolation regions 11, 11. An opening 23a is formed in the mask material 23 by photolithography and etching, for example, and the central portion of the active region 12 is exposed selectively by this opening 23a. The opening 23a may be in a circular or rectangular shape according to necessity.

Figure 3B:
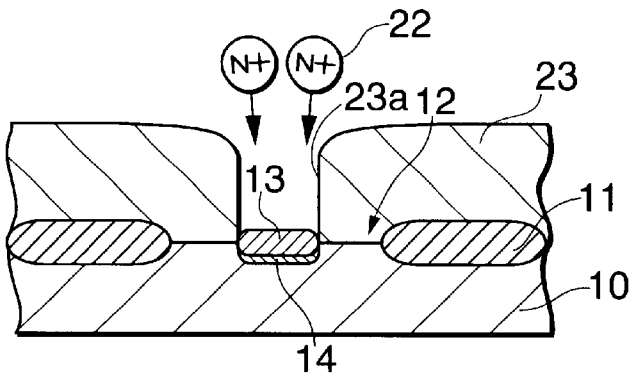

As shown in FIG. 3(b), nitrogen ions 22 are implanted through the opening 23a into the central portion of the exposed active region 12 by an ion implantation technique as in the second embodiment. After a partial implantation of nitrogen irons in the central portion of the active region 12, the semiconductor substrate 10 is given the first heat treatment, preferably, by RTA mentioned above in an atmosphere of nitrous oxide gas as in the second embodiment.

Because the above-mentioned implantation of nitrogen ions 22 in the active region 12 is done through the opening 23a in the mask material 23, the nitrogen atoms are not diffused widely beyond the region corresponding to the opening 23a and are introduced in that central portion of the active region 12 which substantially corresponds to the opening 23a. Furthermore, because the first heat treatment is done with the mask material 23 remaining where it is, the silicon oxide film 13 having nitrogen atoms is formed on the central portion corresponding to the opening 23a in the mask material 23.

After the nitrogen-containing silicon oxide film 13 is formed by the above-mentioned pretreatment process including ion implantation and the first heat treatment, the semiconductor substrate 10 is subjected to the segregation process by the second heat treatment same as the one described above. By this segregation process, a silicon nitride layer 14, which substantially corresponds to the opening 23a in the mask material 23, is formed between the silicon oxide film 13 formed on the central portion of the active region and the semiconductor substrate 10.

After the formation of the silicon nitride layer 14, the silicon oxide film 13 formed in an area corresponding to the opening 23a in the mask material 23 and the mask material 23 are removed by etching using a solution of hydrofluoric acid, which was used in the first embodiment.

Figure 3C:
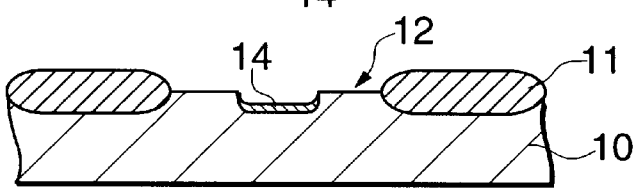
Figure 3D:
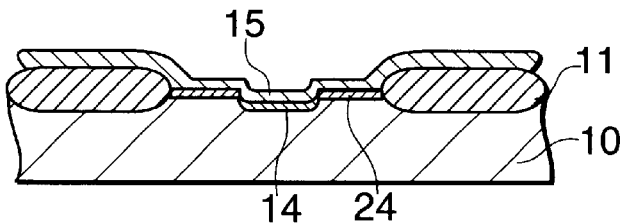
Figure 3E:
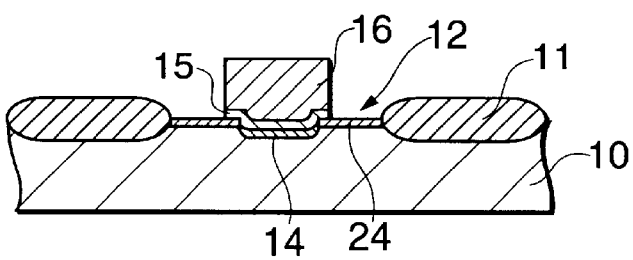
Figure 3F:
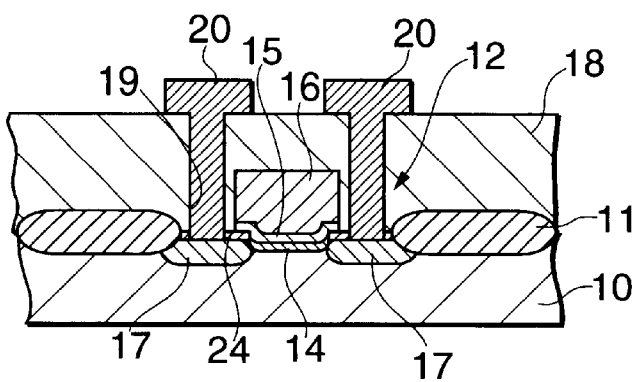

Consequently, as shown in FIG. 3(c), as the silicon nitride layer 14 is formed substantially in the center of the active region 12, the central portion of the active region 12 is covered with the silicon nitride layer 14. On the other hand, in that area of the active region 12 which surrounds the silicon nitride layer 14, the surface of the semiconductor substrate 10 is exposed.

After the formation of the silicon nitride layer 14, as shown in FIG. 3(*d*), a tantalum oxide layer 15 with a thickness of 2 nm to 20 nm, for example, is formed in an oxygen gas atmosphere by MOCVD as was used in the foregoing embodiments. The tantalum oxide layer 15 further receives oxidation annealing by RTA, for example, in an oxygen gas atmosphere.

In the formation of the tantalum oxide layer 15 and its subsequent oxidation annealing in this oxidizing gas atmosphere, because of the oxygen blocking ability of the silicon nitride layer 14 that covers the central portion of the active region 12, the silicon oxide does not grow under the silicon nitride layer 14. In contrast, in that exposed area of the active region 12 which surrounds the silicon nitride layer 14, a silicon oxide film 24 grows so as to cover the area between the silicon nitride layer 14 and the isolation regions 11, 11 as shown in FIG. 3(*d*).

After this, on the gate oxide film (14 and 15) consisting of the silicon nitride layer 14 and the tantalum oxide layer 15, as shown in FIG. 3(*e*), a gate electrode 16 is formed by depositing a gate electrode material by sputtering, for example, as in the first embodiment, followed by photolithography and etching as used in the other embodiments.

In the third embodiment, that unwanted portion of the tantalum oxide layer 15, which extends beyond the gate electrode 16, is removed simultaneously when the unnecessary portion of the gate electrode material is removed as mentioned above.

After the formation of the gate electrode 16, as shown in FIG. 13(*f*), source and drain regions 17, 17 are formed, as in the other embodiments, by ion implantation and heat treatment through the silicon oxide film 24 surrounding the gate electrode 16 and the silicon nitride layer 14 lying under the gate electrode. Finally, contact holes 19 leading to the source and drain regions 17, 17 are formed to pass through the inter-layer dielectric 18 deposited over the gate electrode 16 and through the silicon oxide film 24, and wiring 20 is formed that fills up the contact holes 19. Thus, a MOS transistor 21 is formed.

According to the method disclosed in the third embodiment, the silicon oxide film 24 formed below the gate electrode 16 and surrounding the silicon nitride layer 14 can be used as an etching stopper film when removing unnecessary portions of the electrode material in etching to thereby form the gate electrode 16.

Therefore, even if relatively lenient allowable errors are set in an etching process for forming the gate electrode 16, MOS transistors 21 having fairly uniform characteristics can be manufactured relatively easily.

In a MOS transistor 21 manufactured by a method shown in the third embodiment, it never occurs that the silicon nitride layer 14 with a high dielectric constant protrudes beyond the gate electrode 16, so that it is possible to set small spacing between adjacent MOS transistors, which is advantageous in down-sizing of devices.

Moreover, because a silicon oxide film 24 with a lower dielectric constant than the silicon nitride layer 14 is formed to surround the silicon nitride 14, abrupt changes are reduced in the induced electric field to the source and drain regions 17, 17, so that a short channel effect can be reduced and performance deterioration due to this short channel effect can be prevented.

<Embodiment 4>

FIGS. 4(*a*) to 4(*f*) show an embodiment in which a mask for partial exposure of the central portion of the active region 12 and thermal diffusion are used in the formation of the silicon oxide film 13 with nitrogen content.

As shown in FIG. 4(*a*), a mask material 23, such as silicon oxide, which covers the isolation regions 11, 11 on the semiconductor substrate 10 and the active region 12 delimited by the isolation regions, is deposited by CVD for example as in the third embodiment. An opening 23*a*, like the one in the third embodiment, is formed in the mask material 23, and by this opening 23*a*, the central portion of the active region 12 is selectively exposed.

Under the condition that the active region 12 is covered with the mask material 23 having an opening 23*a*, the semiconductor substrate 10 receives the first heat treatment by RTA, for example, in an atmosphere of nitrous oxide gas as shown in the first embodiment.

By the first heat treatment, the silicon oxide film 13 with nitrogen content with a thickness of 1 nm to 20 nm, for example, on the central portion of the active region 12 as shown in FIG. 4(*b*). By the second heat treatment as described above, which follows the first heat treatment, the silicon nitride layer 14 with a thickness of 0.4 nm to 2 nm, for example, by segregation of the nitrogen content between the silicon oxide film 13 and the semiconductor substrate 10 as shown in FIG. 4(*b*).

After the formation of the silicon nitride layer 14, the silicon oxide film 13 and the mask material 23 are removed by using an etchant, such as the hydrofluirc acid solution mentioned above. Therefore, the silicon nitride layer 14 covering the central portion of the active region 12 is exposed as shown in FIG. 4(*c*).

By a method using the mask material as described above, the silicon nitride layer 14 is formed by reaction of nitrogen content introduced into the active region 12 of the semiconductor substrate 10 through the opening 23*a* of the mask material by thermal diffusion in a nitrogen gas atmosphere. The introduction of the nitrogen content by thermal diffusion takes place in that area beyond the peripheral edge of the opening 23*a* which is wider than the nitrogen-implanted area by ion implantation. For this reason, the silicon nitride layer 14 includes a bottom portion 14*a* with a substantially uniform thickness and an annular rising portion 14*b* with a substantially uniform thickness, which rises from the peripheral edge of the bottom portion.

After the silicon nitride layer 14 having the bottom portion 14*a* and the rising portion 14*b* is formed, the silicon oxide film 13 formed in an area corresponding to the opening 23*a* in the mask material 23 is removed, and then the tantalum oxide layer 15 is formed with a thickness of 2 nm to 20 nm, for example, in an oxygen gas atmosphere by MOCVD used also in other embodiments as shown in FIG. 4(*d*). Furthermore, the tantalum oxide film receives oxidizing annealing by RTA, for example, in an oxygen gas atmosphere.

By the formation of the tantalum oxide layer 15 and its subsequent oxidizing annealing, the silicon oxide film 24 grows in the same manner as in the third embodiment to cover the area lying from the silicon nitride layer 14 to that exposed peripheral area of the active region which surround the silicon nitride layer 14 between the isolation regions 11, 11.

Subsequently, as shown in FIG. 4(*e*) and in the same manner as in the third embodiment, on the gate oxide film (14 and 15) consisting of the silicon nitride layer 14 and the tantalum oxide layer 15, a gate electrode 16 is formed by depositing a gate electrode material by sputtering as described above and by using photolithography and etching as described above.

Figure 4A:
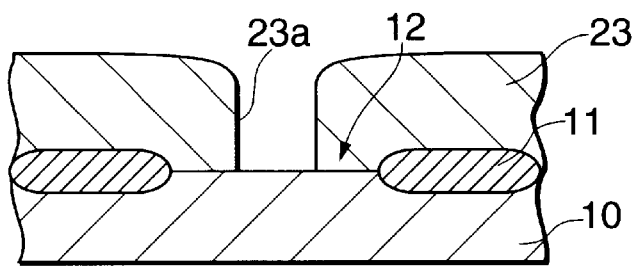
FIGS. 4(a) to 4(f) show the manufacturing steps of a fourth embodiment of the method for manufacturing a MOS transistor according to the present invention.
Figure 4B:
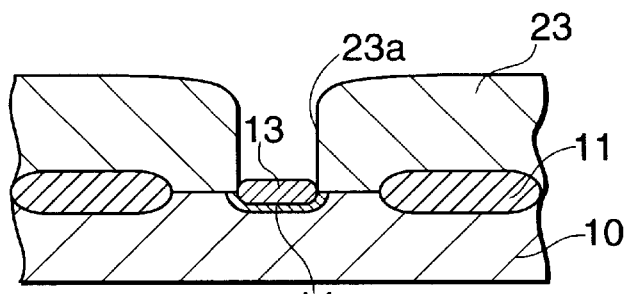
Figure 4C:
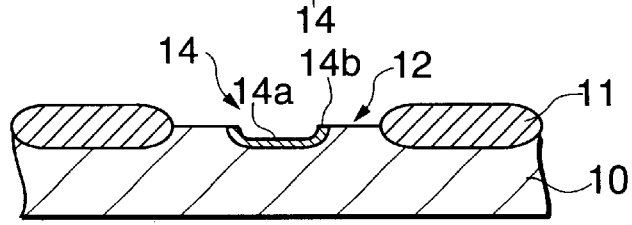
Figure 4D:
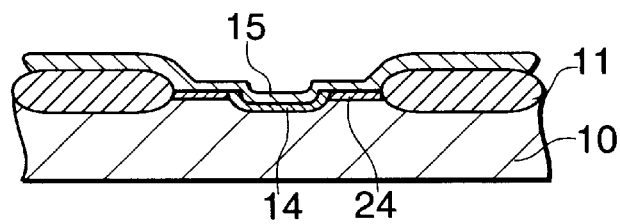
Figure 4E:
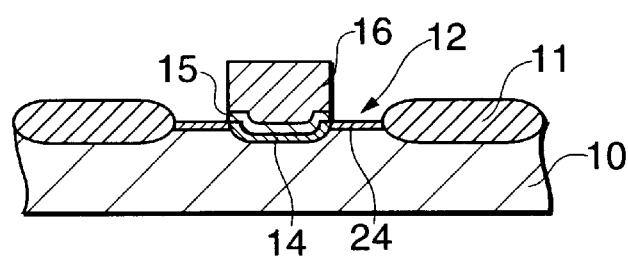
Figure 4F:
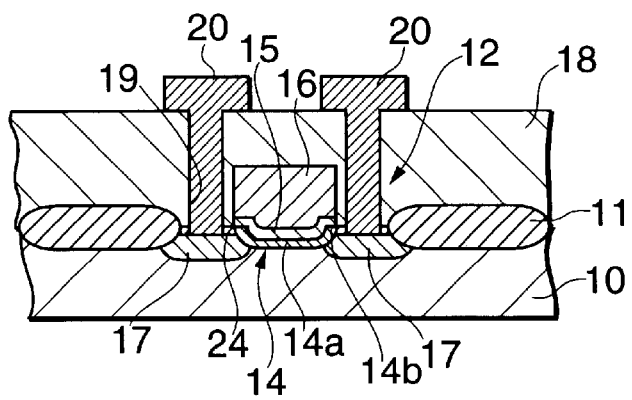

After the formation of the gate electrode 16, as shown in FIG. 4(f), source and drain regions 17, 17 same as those in the other embodiments are formed by ion implantation and heat treatment through the silicon oxide film 24 surrounding the silicon nitride layer 14 under the gate electrode 16 and protruding beyond the gate electrode. In addition, contact holes 19 leading to the source and drain regions 17, 17 are formed to pass through the inter-layer dielectric 18 deposited over the gate electrode 16 and through the silicon oxide film 24, and wiring 20 is formed that fills up the contact holes 19. Thus, a MOS transistor 21 is formed.

According the method shown in the fourth embodiment, as an alternative to ion implantation, thermal diffusion is used for the introduction of nitrogen content into the active region 12. Therefore, it is possible to prevent the charge accumulation in the semiconductor substrate 10 by ion implantation and prevent damage of the gate electrode film (14 and 15) caused by charge accumulation. This advantage is particularly effective in devices, such as SO, in which the substrate is insulated by an oxide film.

In the silicon nitride layer 14 formed by the segregation process carried out after the introduction of nitrogen content into the active region 12 by thermal diffusion, the rising portion 14b is formed which rises in a uniform thickness from the peripheral edge of the bottom portion 14a as mentioned above.

As shown in FIG. 4(f), this rising portion 14b, which intervenes between the gate electrode 16, and the silicon oxide film 24 and the source and drain regions 17, 17, serves as a barrier to diffusion of impurities into the gate electrode 16.

Therefore, according to the method in the fourth embodiment, it is possible to prevent the decrease in dielectric strength of the gate electrode 16, which would result if the impurities were diffused into the gate electrode 16 from the source and drain regions 17, 17. Consequently, the dielectric strength of the gate electrode 16 can be made higher than would otherwise be the case and it becomes possible to manufacture a MOS transistor 21 with excellent dielectric strength. In the foregoing, as a gaseous atmosphere for pretreatment, a nitrous oxide gas ($N_2O$) has been used. Alternatively, it is possible to suitably select a gaseous atmosphere containing nitrogen atoms, such as nitrogen monoxide (NO). In heat treatment as pretreatment, in place of RTA, an annealing process using an ordinary heating furnace or the like may be adopted.

For a gaseous atmosphere for the segregation process, not only nitrogen gas mentioned above but also an inert gas such as argon may be used. In the segregation process, as in the pretreatment, instead of RTA, an annealing process using an ordinary heating furnace or the like may be adopted.

When an annealing process using a heating furnace is adopted in the segregation process, a gaseous atmosphere at atmospheric or lower pressure may be used, but it is preferable to adopt a high-pressure atmosphere to achieve efficient segregation of nitrogen atoms.

As the high dielectric oxide film, in place of tantalum oxide mentioned above, any of various kinds of high dielectric oxide films, such as $Al_2O_3$, $TiO_3$, $ZrO_2$, $(Ba, Sr)TO_3$, $Pb(Zr, Ti)O_3$, may be used.

According to the present invention, as described above, by having a silicon nitride layer segregate out at the interface between the silicon oxide film with nitrogen content formed on the active region of a silicon semiconductor substrate and the silicon substrate, and after the unnecessary silicon oxide film on the silicon nitride film is removed, by forming a high dielectric oxide layer with a higher dielectric constant than the dielectric constant of the silicon nitride film on the exposed silicon nitride layer, a gate oxide film of a multi-layered structure, which has a high dielectric constant, without permitting charge traps to occur. Therefore, it is possible to manufacture a MOS transistor with improved operating speed obtained by an increased electrostatic capacity without incurring deterioration of characteristics which would otherwise be caused by charge traps.

What is claimed is:

1. A method for manufacturing a MOS transistor having a gate oxide film formed on an active region of a silicon semiconductor substrate, said gate oxide film consisting of a silicon nitride layer for inhibiting the penetration of oxygen into the silicon substrate and a high dielectric oxide layer with higher dielectric constant than the dielectric constant of said silicon nitride layer, comprising the steps of:

pretreatment for forming a silicon oxide film with nitrogen atoms on said active region;

segregation for causing a silicon nitride layer to segregate out at an interface between said silicon substrate and said silicon oxide film by heat-treating the pretreated silicon substrate in an inert gas atmosphere;

forming a high dielectric film by removing the unnecessary silicon oxide film on the silicon nitride layer to expose a segregated silicon nitride layer and depositing a high dielectric oxide layer on the exposed silicon nitride layer; and forming a gate on said gate oxide film consisting of said silicon nitride layer and said high dielectric oxide layer.

2. A method set forth in claim 1, wherein the formation of said high dielectric oxide layer is done in an oxygen gas atmosphere.

3. A method set forth in claim 1, wherein said pretreatment step is to carry out an annealing process in an atmosphere of nitrogen oxide.

4. A method set forth in claim 1, wherein said pretreatment step comprises the steps of nitrogen ion implantation for introducing nitrogen content into said active region, and heat treatment for forming said silicon oxide film.

5. A method set forth in claim 1, wherein said segregation step comprises an annealing process by rapid thermal annealing.

* * * * *